United States Patent [19]

Swenson et al.

[11] Patent Number: 4,598,357
[45] Date of Patent: Jul. 1, 1986

[54] CACHE/DISK SUBSYSTEM WITH FILE NUMBER FOR RECOVERY OF CACHED DATA

[75] Inventors: Robert E. Swenson, Mendota Heights; Merlin L. Hanson, Arden Hills; Larry J. Kelson, Shoreview, all of Minn.

[73] Assignee: Sperry Corporation, New York, N.Y.

[21] Appl. No.: 460,737

[22] Filed: Jan. 25, 1983

Related U.S. Application Data

[63] Continuation-in-part of Ser. No. 207,155, Nov. 14, 1980, abandoned.

[51] Int. Cl.⁴ ............ G06F 11/00; G06F 12/12; G06F 13/00
[52] U.S. Cl. .................................. 364/200; 371/10
[58] Field of Search ... 364/200 MS File, 900 MS file; 371/10

[56] References Cited

U.S. PATENT DOCUMENTS

| | | | |
|---|---|---|---|
| 3,771,143 | 11/1973 | Taylor | 364/200 |
| 4,053,752 | 10/1977 | De John et al. | 364/200 |
| 4,084,231 | 4/1978 | Capozzi et al. | 364/200 |
| 4,419,725 | 12/1983 | George et al. | 371/10 |
| 4,434,487 | 2/1984 | Rubinson et al. | 371/10 |
| 4,530,054 | 7/1985 | Hainstra et al. | 364/200 |

Primary Examiner—Eddie P. Chan
Attorney, Agent, or Firm—Griffin, Branigan & Butler

[57] ABSTRACT

In a cache/disk sybsystem employing the post-store technique, each file is assigned a file number. The file number is an address in a directory on a disk, this address containing pointers to the physical disk space assigned to that file. During normal operation of the subsystem a device number and address are utilized to transfer written-to segments of data from a cache store to a disk. If a failure occurs which prevents the cache-to-disk transfer of a segment of data, a storage control unit forms a status word and a sense message. The sense message includes the file number and information defining the fault. A host processor is then notified that the status word is available. The host processor obtains the status word and indexes into a status action branch table. The branch table entry directs the host processor to issue a Sense I/O command to obtain from the storage control unit the sense message identifying the fault. The executive program of the host processor may subsequently utilize the sense message, which also includes the file number, to assign new disk space at which the segment of data may be recorded. The segment of data which could not be written to the disk is first read into the host processor. The host processor then issues a command to write the segment of data into the newly assigned disk space.

8 Claims, 21 Drawing Figures

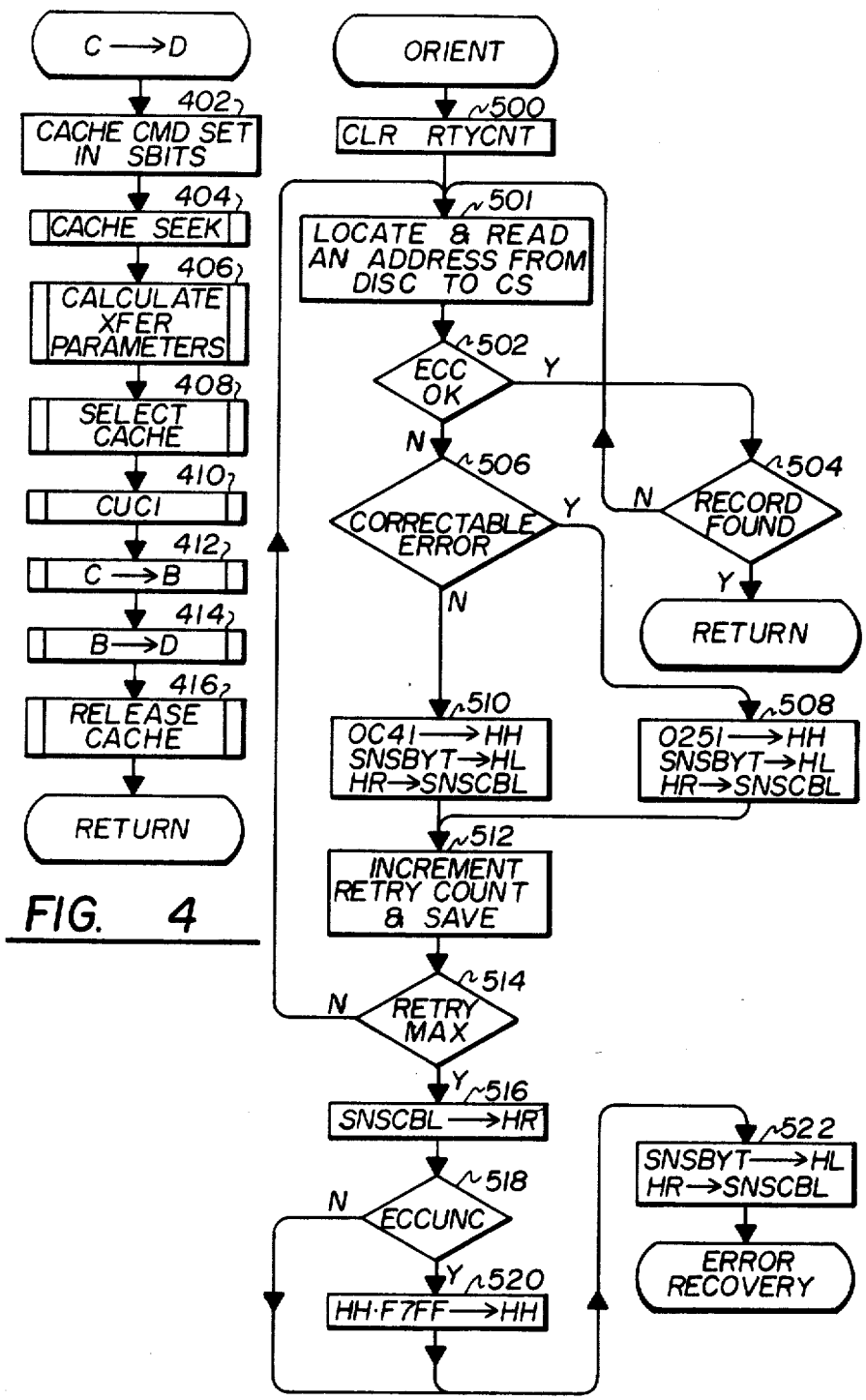

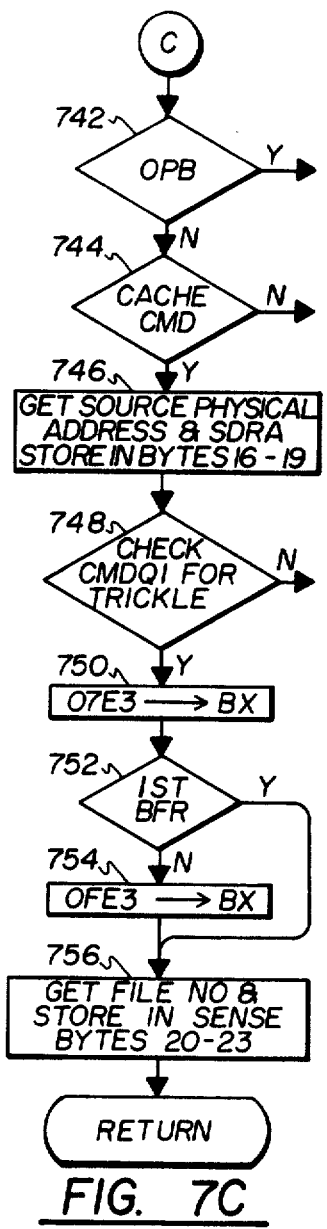
FIG. 7C
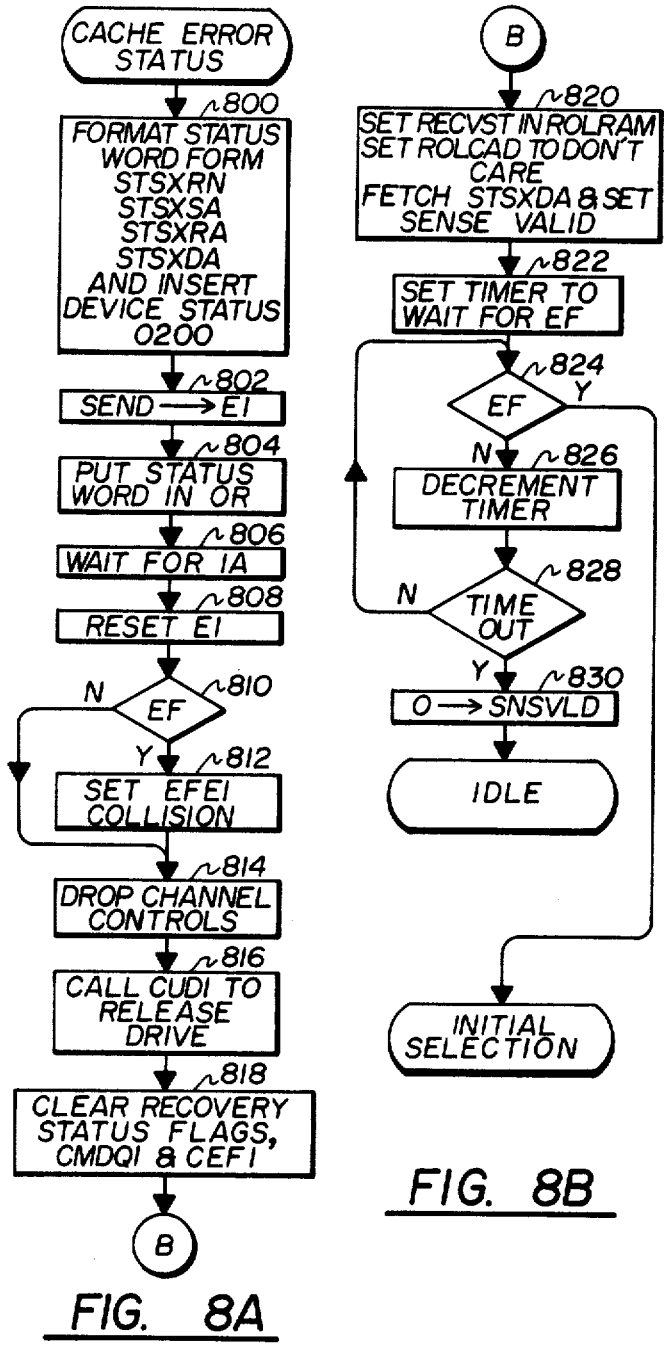
FIG. 8A
FIG. 8B

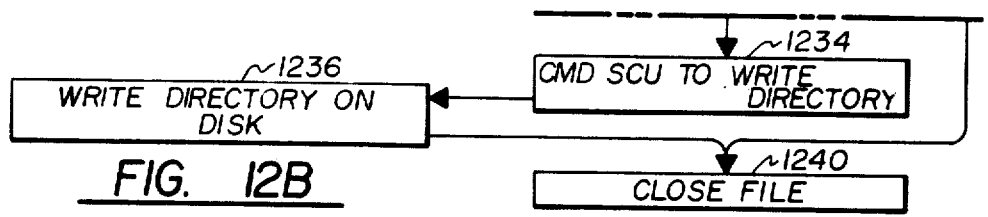
FIG. 12B
FIG. 12
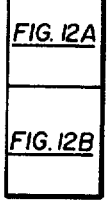
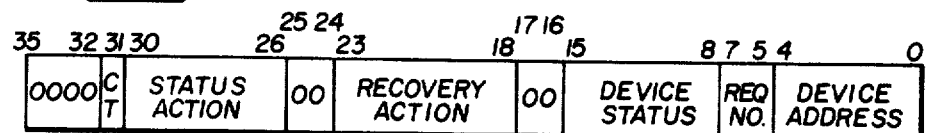
FIG. 9
| BYTE 0 | BYTE 1 | BYTE 2 | BYTE 3 |
|---|---|---|---|
| 00001000 | 10000000 | 00000000 | RECOVERY ACTION |
FIG. 10A
| BYTE 4 | BYTE 5 | BYTE 6 | BYTE 7 |
|---|---|---|---|
| PHYSICAL ID | LOW ORDER CYLINDER | HIGH ORDER CYLINDER & HEAD | FMT DCD & MESSAGE DCD |
FIG. 10B
| BYTES 8 & 9 | BYTES 10 & 11 |
|---|---|
| LAST SEEK ADDRESS | |
| CYLINDER NUMBER | HEAD NUMBER |
FIG. 10C
| BYTE 12 | BYTE 13 | BYTE 14 | BYTE 15 |
|---|---|---|---|
| RECORD NUMBER | SECTOR NUMBER | 00000000 | RETRY COUNT |
FIG. 10D
| BYTE 16 | BYTE 17-19 | BYTE 20-23 |
|---|---|---|
| SOURCE PHYSICAL ADDRESS | SDRA | FILE NUMBER |
FIG. 10E
| 0 | 1 | 2 ... 31 |
|---|---|---|
| O | T | FILE NUMBER |
FIG. 11

CACHE/DISK SUBSYSTEM WITH FILE NUMBER FOR RECOVERY OF CACHED DATA

RELATED APPLICATION

This application is a continuation-in-part of copending application Ser. No. 207,155 filed Nov. 14, 1980 now abandoned. This application is also related to copending application Ser. No. 207,152 (Application A) filed Nov. 14, 1980 now U.S. Pat. No. 4,394,733 and application Ser. No. 354,327 (Application B) filed Mar. 3, 1982, now U.S. Pat. No. 4,523,206, the disclosures of which are incorporated herein by reference.

BACKGROUND OF THE INVENTION

The present invention relates to a data processing system having one or more disk drive devices, a cache store, at least one host processor, and at least one storage control unit for controlling transfers of data between the host processor, the cache store and the disk drive devices. More particularly, the present invention provides a method and means for overcoming faults in the system resulting from various conditions such as the inability to write a record on a disk after that record has been written-to or modified while in the cache store.

The above-referenced Application A discloses a cache/disk subsystem wherein a host processor wishing to write data on a disk issues a command to a storage control unit. The command specifies the operation to be performed (i.e. write) and the address of the disk space at which the operation is to take place. The storage control unit first checks to see if a copy of the data from the specified disk space is resident in the cache store. If it is, the data is then transferred from the host processor through the storage control unit to the cache store. If a copy of the data from the specified disk space is not resident in the cache store then the storage control unit causes the data from the desired disk space to be transferred to the cache store and overwritten with the data from the host processor.

Data is stored in the cache store by segments. The system uses the post-store method of destaging to the disk segments which have been written to while resident in the cache store. Written-to segments are destaged under the control of the storage control unit according to a variable priority scheme as disclosed in Application B. Thus, there may be an extended interval between the time a segment in the cache store is written-to and the time the storage control unit is ready to return the written-to segment to its disk space. During this interval the host processor may have discarded its normal directory linkages for the user program. Therefore, if a fault should occur such that the storage control unit cannot return a written-to segment to its disk space, the process for recovering from the fault could be very time consuming.

The present invention provides a file number which is issued by the host processor with a command, and stored under the control of the storage control unit for use if a fault occurs. Upon occurrence of a fault the file number may then be utilized by the host processor to speed up the error recovery.

SUMMARY OF THE INVENTION

An object of the present invention is to provide a method and apparatus for writing a segment of data on a disk when the normal means for destaging the segment from a cache store to the disk fails.

An object of the present invention is to provide a file number in commands issued by a host processor, the file number being the address in a directory on a disk which stores pointers to the physical disk addresses assigned to that file. When a segment of data cannot be destaged from a cache store to a disk, the file number is used to access the directory and obtain the pointers. From the pointers and a sense message formed at the time the destaging fails, the host processor is able to assign new disk space at which the segment of data is then recorded.

An object of the present invention is to provide an improvement in a cache/disk system of the type including a host processor for issuing commands specifying an operation to be performed and an address, a disk drive device for driving a disk, a cache store for storing segments of data, a segment descriptor store for storing a segment descriptor corresponding to each of the segments of data, and a storage control unit interfacing with the host processor, the disk drive device, the cache store and the segment descriptor store, the storage control unit including means for destaging to the disk segments of data which have been written to while in the cache store, the improvement comprising: means in the host processor for issuing a file number as part of a command, the file number specifying an address in a directory recorded on the disk; means in the storage control unit for storing the file number as part of the segment descriptor associated with a data segment involved in the operation specified by the command; detecting means for detecting when the means for destaging segments of data to the disk is unable to destage a segment; means responsive to the detecting means for generating a status word and a sense message, the sense message including the file number; and, means for transmitting the status word and the sense message to the host processor.

An object of the inventon is to provide an improvement as described above wherein the directory recorded on the disk comprises pointers to the physical disk space assigned to each file, the host processor including means for issuing to the storage control unit a command including the file number, the storage control unit including means responsive to the file number in the command for reading the pointers to the physical disk space assigned to that file from the directory and transmitting them to the host processor.

A further object of the invention is to provide an improvement as describe above wherein the host processor includes means responsive to the sense message and the pointers for determining the physical address space to which the storage control unit was unable to destage a segment, and generating an address of substitute disk space.

A further object of the invention is to provide an improvement as described above wherein the host processor includes means for issuing to the storage control unit a command to read from the cache store to the host processor the segment of data which could not be destaged; and means in the host processor for issuing to the storage control unit a command to write the segment of data which could not be destaged into the substitute disk space.

Another object of the present invention is to provide a method of facilitating error recovery in a cache/disk system of the type including a host processor for issuing commands specifying an operation to be performed and an address, a disk drive device for driving a disk, a cache store for storing segments of data, a segment descriptor store for storing a segment descriptor corresponding to each of the segments of data, and a storage control unit interfacing with the host processor, the disk drive device, the cache store, and the segment descriptor store, the storage control unit including means for destaging to the disk segments of data which have been written to while in the cache store, a method of facilitating recovery when the storage control unit is unable to destage a segment of data to the disk, the method comprising: recording on the disk a directory comprising pointers to the disk space assigned to each file; issuing a file number as part of a command issued by the host processor, the file number being the address in the directory of the pointers to the disk space assigned to the file represented by the file number; storing the file number in a segment descriptor associated with a data segment involved in the operation specified by the command; detecting when the storage control unit is unable to destage a data segment to the disk; forming a sense message including the file number when it is detected that a segment cannot be destaged to the disk; determining from the message the segment of data which could not be destaged; assigning new disk space to the segment which could not be destaged; and recording the segment which could not be destaged in the new disk space.

A further object of the invention is to provide a method as described above wherein the sense message is formed in the storage control unit, the method further comprising: forming a status word in the storage control unit when it is detected that a segment of data cannot be destaged to the disk; transmitting the status word to the host processor; in response to the transmitted status word issuing a command from the host processor to the storage control unit to transfer the sense message to the host processor; and issuing a command from the host processor to read from the disk into the host processor the pointers at the address specified by the file number, whereby the determination of the segment of data which could not be destaged is made in the host processor.

Another object of the invention is to provide a method as described above wherein the step of recording the segment of data which could not be destaged comprises: issuing a command from the host processor to the storage control unit to read into the host processor the segment of data which could not be destaged; issuing a command from the host processor to write the segment of data which could not be destaged on the disk in the new disk space; and transferring from the host processor through the storage control unit, to the disk the segment of data which could not be destaged.

Other objects of the invention and its mode of operation will become apparent upon consideration of the following description and the accompanying drawings.

BRIEF DESCRIPTION OF THE DRAWINGS

FIG. 4 is a flow diagram illustrating the Cache-to-Disk subroutine;

FIG. 5 is a flow diagram illustrating the Orient subroutine;

FIG. 6 is a flow diagram illustrating the Error Recovery routine;

FIGS. 7A-7C comprise a flow diagram illustrating the Sense Format subroutine;

FIGS. 8A and 8B comprise a flow diagram illustrating the Cache Error Status subroutine;

FIG. 9 illustrates the format of a status word;

FIGS. 10A-10E illustrate a Format 4 sense message;

FIG. 11 illustrates the format of the third word of an SDT entry; and

FIGS. 12A and 12B, when arranged as shown in FIG. 12 is a diagram illustrating the sequence of operations in recovering from an error when a Trickle Write command cannot be executed because the address of a record to be written is obliterated.

DETAILED DESCRIPTION OF THE INVENTION

Figure 1:
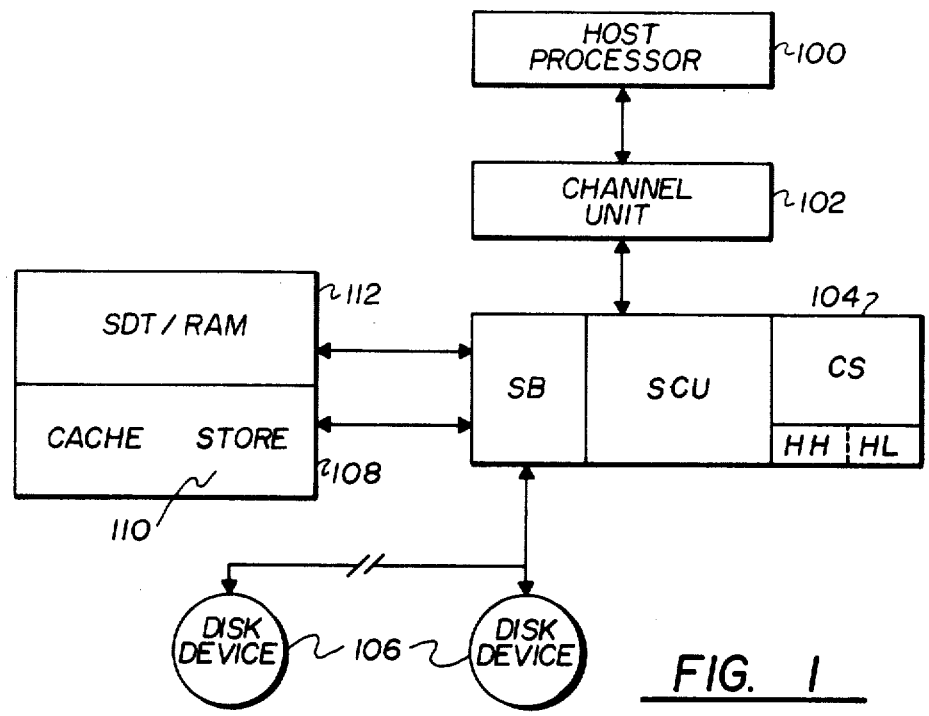
FIG. 1 is a block diagram of a cache/disk system.

FIG. 1 is a simplified block diagram illustrating a system such as that disclosed in above-mentioned Application A. The system includes at least one host processor 100 connected through at least one channel unit 102 to at least one storage control unit (SCU) 104. The system is provided with a plurality of disk drive devices 106 for driving storage disks. A cache memory 108 is provided which includes a cache store 110 for storing segments of data and a RAM 112 for storing global variables.

As explained in Application A, the SCU 104 controls the transfer of data between the disk 106, cache store 110 and the host processor 100. When the host processor wishes to access disk space to read the data in the disk space, or to write data into the disk space, it issues a command specifying the operation to be performed. The command also specifies the address of the disk space at which the operation is to be performed by specifying the address of the first word and the number word locations.

Figure 2:
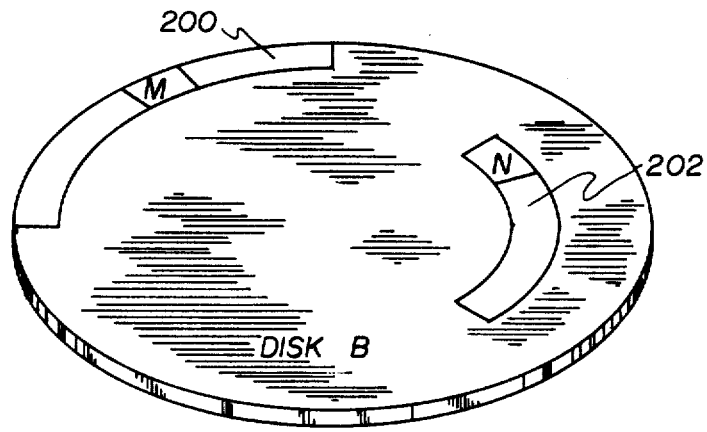
FIG. 2 illustrates a recording disk having a directory and data recorded thereon.

Data transfers between the cache store 110 and the disks is managed by segments, each segment containing 1792 words. Formatting of data on the disks may vary depending upon the specific type of disk drive unit employed. As an example, in the model 8450 disk drive manufactured by Sperry Corporation, data may be formatted as segments each containing four records, each record containing 448 words. For the model 8470, each record is one segment (1792 words) long. In either case, each record is preceded by an address field which specifies the address of the record which follows. When the host processor issues a command, the SCU 104 converts the address portion of the command into a segment device relative address (SDRA) which is used to search a segment descriptor table (SDT) to determine if a copy of the data from the specified disk space is resident in one or more segments in the cache store. The SDT has an entry therein for each segment of data in the cache store and an entry has a format as shown in FIG. 2 of Application B except that the word containing the file number has the format shown in FIG. 11 of the present invention. If the data is resident in the cache store then the SCU initiates the operation specified by the command and during this operation the data is transferred between the host processor and the cache store. If the data is not resident in the cache store the command is added to a command queue having the format illustrated in FIG. 3 of Application B. There is one command queue for each disk drive device. The command queues are normally resident in RAM 112 and are brought into the SCU for updating and controlling transfers of segments of data between the disks and the cache store. When SCU 104 is not engaged in accepting commands from the host processor it may initiate execution of one command from one of the command queues to bring required segments of data into the cache store. As the data is copied into the cache store it may be overwritten with data from the host processor (write command) or transferred in whole or in part to the host processor (read command).

Segments of data which have been written to while in the cache store are not immediately returned to their disk space. When the SCU is not otherwise busy it may execute a Check Trickle routine as shown in FIGS. 11A-11I of Application B to generate a Trickle Write command for each disk device if there is a written-to segment in the cache store which has not been destaged to that disk device, and the command queue for that disk device does not already have a Trickle Write command queued therein. As explained in detail in Application B, the SCU subsequently executes a Trickle Write command when the command eventually becomes the highest priority command in its queue and the disk device associated with that queue is not busy.

From the foregoing summary of Applications A and B, it is seen that a problem develops if the Trickle Write routine is unable to destage a segment. There could be many reasons for this but for purposes of illustration assume that a disk has developed a bad spot in the address field preceding one of the record areas into which the segment is to be written. Since the proper record address cannot be located on the disk, the SCU is unable to properly complete the Trickle Write routine and transfer that record to the disk. Because a long period of time (relatively speaking) may have elapsed between the time the segment was last written-to while in the cache store and the time the attempt is made to destage it, the host processor may have discarded its normal directory linkages for the user program or the directory itself may reflect release and reassignment of the disk space. Thus, error recovery could be difficult and require a substantial amount of host processor time.

To overcome this difficulty and speed up recovery from errors of the type described above, a file number is provided. Each cache command issued by the host processor 100 includes a file number. When a host processor issues a command this file number is stored in the SDT entry (or entries) corresponding to the segment (or segments) in the cache store which are involved in the commanded operation.

Referring now to FIG. 2, a disk B is illustrated as having a directory 200 recorded on one portion thereof and a record 202 recorded on a second portion thereof. The record 202 is preceded on its track by the address N of the record. The address N includes not only the data defining the address N but also an Error Correction Code (ECC) which permits detection of double errors and detection and correction of single errors if a bad spot should develop on the disk which mutilates the address signals.

Figure 3A:
FIGS. 3A and 3B are diagrams illustrating the assignment of new disk space to a segment of data when that segment cannot be written to its normal space on the disk.

The directory 200 defines which areas on disk B are assigned to each file. The directory occupies a plurality of addresses, one of these addresses being shown in FIG. 2 as address M which may be addressed using file number M as the address. Recorded at address M are pointers which point to those areas or physical disk spaces of disk B assigned to store data for file M. As illustrated in FIG. 3A, address M may contain the starting address and number of segments in a first disk space $M_1$ assigned to file M and the starting address and number of segments in a second disk space $M_2$ also assigned to file M. Address M also contains various other information such as file name, etc. which is not relevant to the present invention.

The assignment of disk space takes place when a file is opened. The host processor 100, which may be a Sperry Corporation 1100 operating system, maintains a table of available disk space. When a file is opened the user program provides an indication of how much disk space will be needed. Based on this, the executive program in the host processor assigns specific disk space to the user program and the addresses of this disk space (i.e. the pointers at address M) are sent to the disk for recording in the directory for that disk. For example, if a user program indicates to the executive program that it will need 100,000 words of logical file space the executive program checks its table of available disk space. Assume that it finds two disk spaces $M_1$ and $M_2$ on disk B, each 50,000 words long which are not assigned. The addresses of the first words and the length of the disk spaces $M_1$ and $M_2$ are stored at M thus pointing to disk spaces $M_1$ and $M_2$.

As the user program is executed the data to be stored is assigned a physical disk space by the executive routine. The host processor maintains, for each file, a value indicating the highest number segment that has been written to in that file. As the user program is executed and the data is sent to storage the value indicating the highest number segment of space used is incremented. Thus, the user program deals with logical file space and not with the physical address of that space on the disk.

As illustrated in FIG. 10A of Application B, during execution of a Trickle Write command, the SCU 104 executes a Cache to Disk Control subroutine which manages the transfer of a written-to segment from the cache store 108 to a staging buffer (SB) in the SCU 104 and then to the disk specified by the command. The Cache-to-Disk Control subroutine is illustrated in greater detail in FIG. 4 of the present application. In the flow diagrams which follow, all notations and symbols are as defined in Applications A and B.

In FIG. 4, the Cache-to-Disk subroutine sets one bit in the status bits (SBITS) to indicate that the cache store 110 is involved in the transfer. Next, a Cache Seek subroutine is called to issue a seek to the disk drive device at which the data is to be written. At step 406 a Calculate Transfer Parameters subroutine is executed to create the cache starting address for the transfer. This subroutine also updates the cache transfer indicators (CXFRI) and sets a Record Count register to indicate the number of words (1792) to be transferred.

At step 408 the Select Cache subroutine is called to select and reserve the cache for the transfer. At step 410 a Control Unit-Cache Interface (CUCI) subroutine is called to reset the written-to bit in a copy of the SDT entry which is attached to the end of the cache segment.

At step 412 a Cache-to-Buffer subroutine is called which transfers the segment of data from the cache store 110 to the staging buffer SB in SCU 104. Next, a Buffer-to-Disk subroutine is called to transfer the segment of data from SB to the disk. If this transfer is successful then at step 416 the Release Cache subroutine is executed and the Cache-to-Disk subroutine returns to the Trickle Write routine.

In order to transfer the segment of data from the staging buffer to the disk the address of each record must be located on the disk. This is accomplished by the Orient subroutine illustrated in FIG. 5.

At the time the Orient subroutine is called, the disk is already rotating and the gating circuits are set to read from the disk. As the Orient routine is entered a retry count (RTYCNT) is reset at step 500. RTYCNT is stored at a location in a control store (CS) within SCU 104. At step 501 the disk drive device locates and reads an address and its accompanying ECC from the disk to the control store CS in SCU 104. At step 502 the address is checked against its ECC to be sure there are no errors in the address. If there are no errors then at step 504 the address read from the disk is compared with the address which the SCU is seeking. If the comparison at step 504 shows that the correct record address has been found then the Orient subroutine returns to the Buffer-to-Disk subroutine 414 to accomplish the transfer of the record of data from the SCU to the disk. The Buffer to Disk subroutine controls the transfer of the record to the disk, updates the transfer parameters and calls the Orient subroutine again to locate the next record to be transferred. Assuming no problems develop, this continues until the full segment has been transferred to the disk.

Anytime the Orient subroutine is called and the test at step 504 shows that the address read from the disk is not the one being sought then the program branches back to step 501 to locate and read the next address from the disk. Thus, steps 501, 502 and 504 are repeated until the correct record is found. There are limitations on this which are not relevant to an understanding of the present invention.

If the test at step 502 indicates that the address read from the disk is incorrect (for example, a bad spot on the disk has obliterated a portion of the address) then the program proceeds to step 506 where it determines whether or not the error is correctable. If the error is correctable the SCU generates information regarding the location of the error and a pattern to correct the error. This information is saved for insertion into a format message. The program then proceeds to step 508 where the value "0251" (the quotation marks indicate hexadecimal) is entered into the two high order bytes of SNSCBL and the base address (SNSBYT) of a sense message in the control store CS is entered into the two low order bytes of SNSCBL. SNSCBL is a location in the control store CS for storing a sense control block, the bits in SNSCBL having the following meaning.

TABLE I

| Byte 0 | Bit 0 | Write Inhibit |
|---|---|---|
| | Bit 1 | Operation Incomplete |
| | Bit 2 | Correctable |
| | Bit 3-4 | Bits 3 and 4 define which byte to store the bit significant data defined in bits 5-7 where: |
| | | Bit 3 4 |
| | | 0 0    SNS Byte 0 and Perm Error |
| | | 0 1    SNS Byte 0 |
| | | 1 0    SNS Byte 1 |
| | | 1 1    SNS Byte 2 |
| | Bit 5-7 | Binary Number of Bit to Turn On |
| Byte 1 | | Format Message - Bits 0-3 = Format |
| | | Bits 4-7 = Message |
| Bytes 2-3 | | Pointer to Sense Area-Address |

If step 506 reveals that the error is not correctable then the program proceeds to step 510 where the value "0C41" is loaded into the high order bytes (0 and 1) of SNSCBL and SNSBYT is loaded into the low order bytes (2 and 3).

After step 508 or 510 is completed the program moves to step 512 where it increments and saves the retry count. The SCU maintains and updates the retry count which is an indication of the number of consecutive times an attempt has been made to read an address from the disk without success. After the retry count is incremented it is tested at step 514 to see if it has reached some maximum value such as, for example, 7. Assuming that it has not, the program loops back to step 501 to locate and read the next address from the disk to the control store.

If the test at step 514 indicates that the maximum of retries has been completed without locating the proper record address, SNSCBL is brought from the control store to a holding register (HR) which is a double-length register comprising two single length registers HL and HH. The second and third characters in HH are compared with the value "C4" at step 518 to see if the error is uncorrectable. This will be the case if, on the last pass through the loop comprising steps 501-514 the value "0C41" was entered into HH at step 510. If the test at step 518 shows that the error is uncorrectable then at step 520 the value "0C41" is changed to "0441". If the test at step 518 shows that the error is correctable then the value in HH remains unchanged. At step 522 SNSBYT is entered into HL and HR is stored at SNSCBL. It should be noted that at this time if the error is uncorrectable SNSCBL stores the following value.

TABLE II

| Byte 0, | Bits 0-4 = 00000 |
|---|---|
| Byte 0, | Bits 5-7 = 100 |
| Byte 1, | Bits 0-3 = 0100 |
| Byte 1, | Bits 4-7 = 0001 |
| Bytes 2-3, | contain SNSBYT, the first address of the sense area |

Figures 6, 7A, 7B:
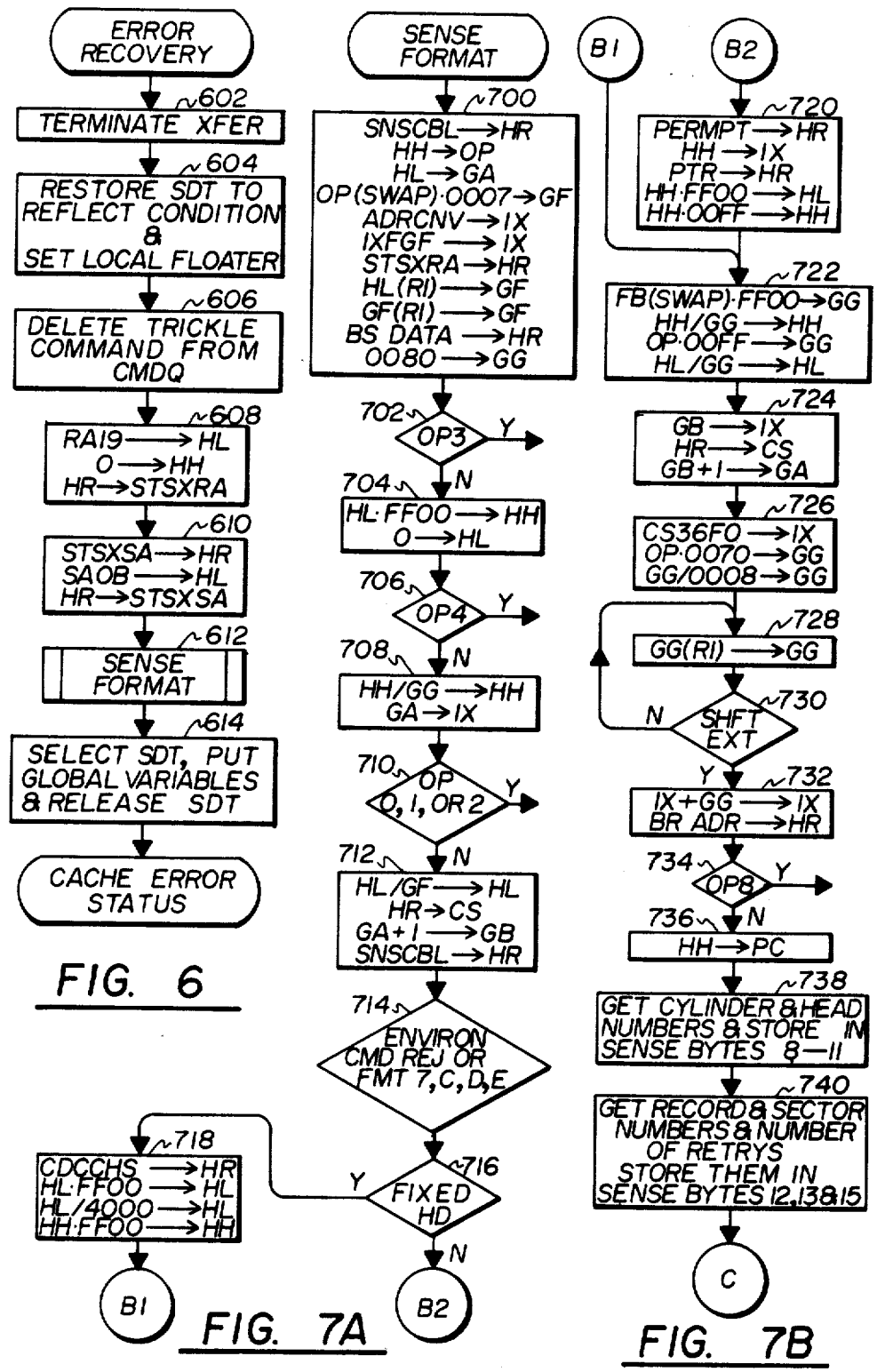

After step 522 is completed the Orient subroutine exits to the Error Recovery routine illustrated in FIG. 6. The Error Recovery subroutine first terminates the operation which has been transferring the segment from the staging buffer in the SCU 104 to the disk. At step 604 values in the segment descriptor table (SDT) entry corresponding to the segment which could not be transferred are restored to reflect the present condition of the segment. In addition, a local floater bit (LFTR) is set in word 2 of the SDT entry corresponding to the segment which could not be transferred. The setting of this bit prevents the SCU 104 from forming any further trickle commands for the segment which could not be transferred.

At step 606 the Trickle Write command which could not be executed is deleted from the command queue. At step 608 recovery action (RA) 19 is stored in the control store at STSXRA and at step 16 status action (SA) OB is stored at STSXSA. The status action and recovery action are used in the Cache Error Status subroutine described below which forms a status word having the format illustrated in FIG. 9.

At step 612 the program executes the Sense Format subroutine to generate a 24-byte sense message. The Sense Format subroutine is illustrated in FIGS. 7A-7C insofar as it relates to the formation of a sense message when a Trickle Write command cannot be executed because a record address cannot be found on a disk. It should be noted that a sense message may be formed for any one of many types of errors. There are, in fact, 13 different message formats and within each of the formats the information may vary depending upon the type of error or fault detected by the system. FIGS. 10A–10E illustrate a format 4 sense message of the type formed when a Trickle Write command cannot be executed because one of the record addresses at which the segment is to be written is partially obliterated on the disk.

In FIG. 7A, the Sense Format subroutine begins by bringing SNSCBL into the holding register HR. SNSCBL at this time has the value which was stored therein at step 522. For an uncorrectable error this value is 0441. Thus, the value entered into HH is,

TABLE III

| BIT = | 0123 | 4567 | 89AB | CDEF |
|---|---|---|---|---|
| HH=OP = | 0000 | 0100 | 0100 | 0001 | while the value entered into HL is the base address SNSBYT for the sense message. The base address is saved in a register GA while the value in HH is transferred to a register OP. Next, the upper eight bits and lower eight bits of OP are swapped and compared with the value 0007. This yields a result of "0004" which is stored in a register GF. The base address (ADRCNV) of a conversion table is entered into an index register IX and summed with the contents of register GF for later use.

The status recovery action, entered into STSXRA at step 608, is right-shifted two places to place it on a byte boundary.

After the recovery action is justified the IX register indexes the conversion table and fetches a value from the conversion table into HR. The purpose of the conversion table is to convert a hexadecimal value into a bit significant value, that is, a value wherein only one bit is set. The first four steps in block 700 isolated bits 5-7 of the value which was initially entered into HR from SNSCBL. From Table III it is seen that these bits have the value "4". Thus, when GF is added to ADRCNV to access the conversion table, the entry accessed stores a value in which the only bit which is a 1 is the fourth bit. Thus, when the bit significant data is read from the table the value "0800" is entered into HR.

Next, a constant value "0080" is entered into GG. At step 702 bit 3 of the OP register is tested to see if it is set. If it is, the subroutine branches to form a sense message which is not relevant to the present invention. From Table III it is seen that OP3 is a 0 hence, the program proceeds to step 704 where HL is ANDed with "FF00" and the result entered into HH. Register HL is cleared. Thus, at this time HH="0800" and HL="0000". At step 706 bit 4 of the OP register is tested. From Table III it is seen that OP4 is not set hence the program proceeds to step 708 where HH is ORed with GG and the result "0880" is entered into HH. At this time HH contains the information which will be entered into sense bytes 0 and 1 shown in FIG. 10A. SNSBY which has been saved in GA is entered into IX and the program proceeds to step 710 where it successively tests bits 0, 1 and 2 of the OP register. From Table III it is seen that all three of these bits are 0 so the program proceeds to step 712 where HL is ORed with GF to thereby place the recovery action in the lower byte of HL. HR is then stored in the control store under the control of the IX register which contains SNSBYT at this time. This loads bytes 0-3 of the format message as shown in FIG. 10A into the address specified by SNSBYT.

GA is then incremented and stored at GB for use as the next address for storing the next four bytes of the format message. SNSCBL is fetched from the control store to HR after which various tests are made on HR at step 714 to see if the error is environmental, command reject or format 7, C, D, or E. The first of these tests check the low order byte for the value "1B" or "08" while the format tests check for the value 7, C, D or E in the upper half of byte 1 of HR. From Table III it is seen that all of these tests will prove false so the program proceeds to step 716 where a test is made to see if a fixed head device is being employed. If it is the program proceeds to step 718 and if the device is not a fixed head device the program proceeds to step 720.

The instructions executed at step 718 obtain the cylinder, head, sector argument (CDCCHS) for a fixed head search, ORs the head argument with the value "4000" and saves the result in HL and places the result in HL for entry into byte 6 of the sense message. The instructions in block 718 also save the lower order bits of the cylinder argument in HH for entry into byte 5 of the sense message. The instructions in block 720 obtain the cylinder and head arguments if the disk drive device involved in the trickle write is not a fixed head device.

The instructions in block 722 obtain the three of six bit code identifying the disk drive device involved in the operation from a register FB and concatenate this physical ID with the low order bits of the cylinder argument in HH. The instructions in block 722 also obtain the format message "41" from OP (see Table III) and concatenate this value with the cylinder/head argument in HH.

The instructions in block 724 set the index register to the storage address of the second word of the sense message, transfer bytes 4–7 (see FIG. 10B) to this address, and increment the address by one and save it in a register GA for use in storing the next word of the format message.

The instructions in block 726 load the base address of a branch table into the register IX and isolate in register GG the value "0040". GG is then ORed with the value "0008" which is used for a shift control at step 728. At step 728 register GG is shifted right one position and at step 730 a test is made to see if the value 1 is shifted out of the right end of the register. Since the low order character entered into GG at step 726 was "8" or 1000, steps 728 and 730 are executed four times. On the fourth time, the test at step 730 proves true. At this time the value "4" is in the right-most positions of register GG. This value is added to the table base address entered into IX at step 726 and the result used to access a table to obtain a branch address which is saved in HR. At step 734 OP8 is tested and, as seen from Table III, this test proves false. The program loads the branch address obtained at step 732 into the program counter and branches to a subroutine for developing bytes 8–23 for a format 4 message. At step 738 the cylinder and head numbers of the last seek address are obtained and stored in sense bytes 8–11 (FIG. 10C). At step 740 the retry count, record number of the record in error, and the sector number of the start of the record in error are obtained and stored in sense bytes 12, 13 and 15 (FIG. 10D).

In FIG. 7C, at step 742 OPB is tested and is false. At step 744 SBITS is tested to see if this is a cache related command. The cache command bit in SBITS was set at step 402 so the program proceeds to step 746 where it obtains the source physical address and segment device relative address (SDRA) and stores them in bytes 16-19 (FIG. 10E). The source physical address comprises two bits identifying an SCU and six bits comprising a three of six-bit address code identifying the disk drive device that wrote the record originally. This information is contained in an ID byte on the disk in an area preceding each record address. The source physical addresses are read from the disk as the record addresses are read and as each source physical address is read from the disk it replaces the prior source physical address at location SORCID in the control store CS.

At step 748 the copy of the command in the control store is checked to see if it is a trickle command. Under the assumed conditions it is hence the program proceeds to step 750 where it places into an index register BX the address in the staging buffer which stores the fourth word of the SDT entry. This word contains the file number. At step 752 a test is made to see if the transfer was between a first buffer and staging buffer SB and the disk at the time the error occurred. If the first buffer was involved then the address entered in register BX at step 750 is utilized to read the file number for the first buffer SDT entry. This takes place at step 756 and the file number thus obtained is stored in sense bytes 20-23. If the error occurred while the second buffer was being utilized then the test at step 752 proves false. The address of the fourth word of the SDT entry for the second buffer is placed in BX at step 754 after which the file number for the second buffer is obtained and stored in sense bytes 20-23. This completes the formation of the sense message and a return is taken to the Error Recovery routine in FIG. 6. The Error Recovery routine then selects the SDT RAM 112, puts the global variables back in the RAM, releases the SDT RAM and exits to the Cache Error Status routine in FIG. 8A.

The Cache Error Status routine generates a status word having the format shown in FIG. 9, sends an external interrupt (EI) to the host processor, and transfers the status word to the host processor informing it that a sense message has been formed and is available for transferring to the host processor. The host processor must respond with a Sense I/O command to read the sense message into the processor. Otherwise, the sense information is reset upon completion of the next command following presentation of a unit check or after a one second time out.

The Cache Error Status routine begins in FIG. 8A at step 800 where it obtains the request number from STSXRN, the status action from STSXSA, the recovery action from STSXRA, and the disk drive device address from STSXDA. The value "0200" is set up as the device status indicating unit check. The words thus formed are saved in general purpose registers and at step 802 the SCU sends an external interrupt (EI) signal to the host processor informing it that the SCU is ready to transmit data. At step 804 the values comprising the status word saved in the general purpose registers are entered into a channel output register OR to await transfer through the channel unit 102 to the host processor. The SCU waits for an input acknowledge signal from the host processor indicating that it has accepted the status words and then resets the EI signal.

At step 810 the SCU checks for an EF (a tag issued simultaneously with a command by the host processor) and if an EF is sensed then at step 812 an EFEI collision indication is set. The significance of the EF-EI collision is not important to an understanding of the present invention and is explained in Application A. Generally, the test at step 810 will show no EF and the program will proceed directly to step 814 to drop the channel controls. At step 816 the CUDI routine is called to release the disk drive. At step 818 the SCU clears the recovery status flags, the copy of the command at CMDQ1 in the control store and location CEF1 in the control store which stores the first word of a command from the host processor.

The program continues in FIG. 8B where the SCU sets the recovery status bit in ROLRAM and sets the value. STSXDA is fetched and updated by setting the eight high-order positions to indicate sense valid.

When the host processor receives the status word it utilizes the value in the status action field to index into a table where it obtains the first instruction of a routine for the specified status action, OB. This routine causes the host processor to issue an EF tag with a Sense I/O command.

At step 822, the SCU loads a timer and begins waiting for the EF tag which it expects from the host processor with the Sense I/O command. At step 824 the SCU checks the tag input from the host processor for the EF. If there is no EF the timer is decremented at step 826 and checked at step 828 to see if the time (one second) has expired. In the event time has expired the program proceeds to a step 830 where it resets the sense valid indication and then proceeds to the Idle routine described in Application A.

At step 828, if time has not expired the program loops back to step 824 to again check for the EF. If the EF is detected the program branches to the Initial Selection routine described in Application A to execute the Sense I/O command and transfer the six-word sense message to the host processor.

Figure 12A:
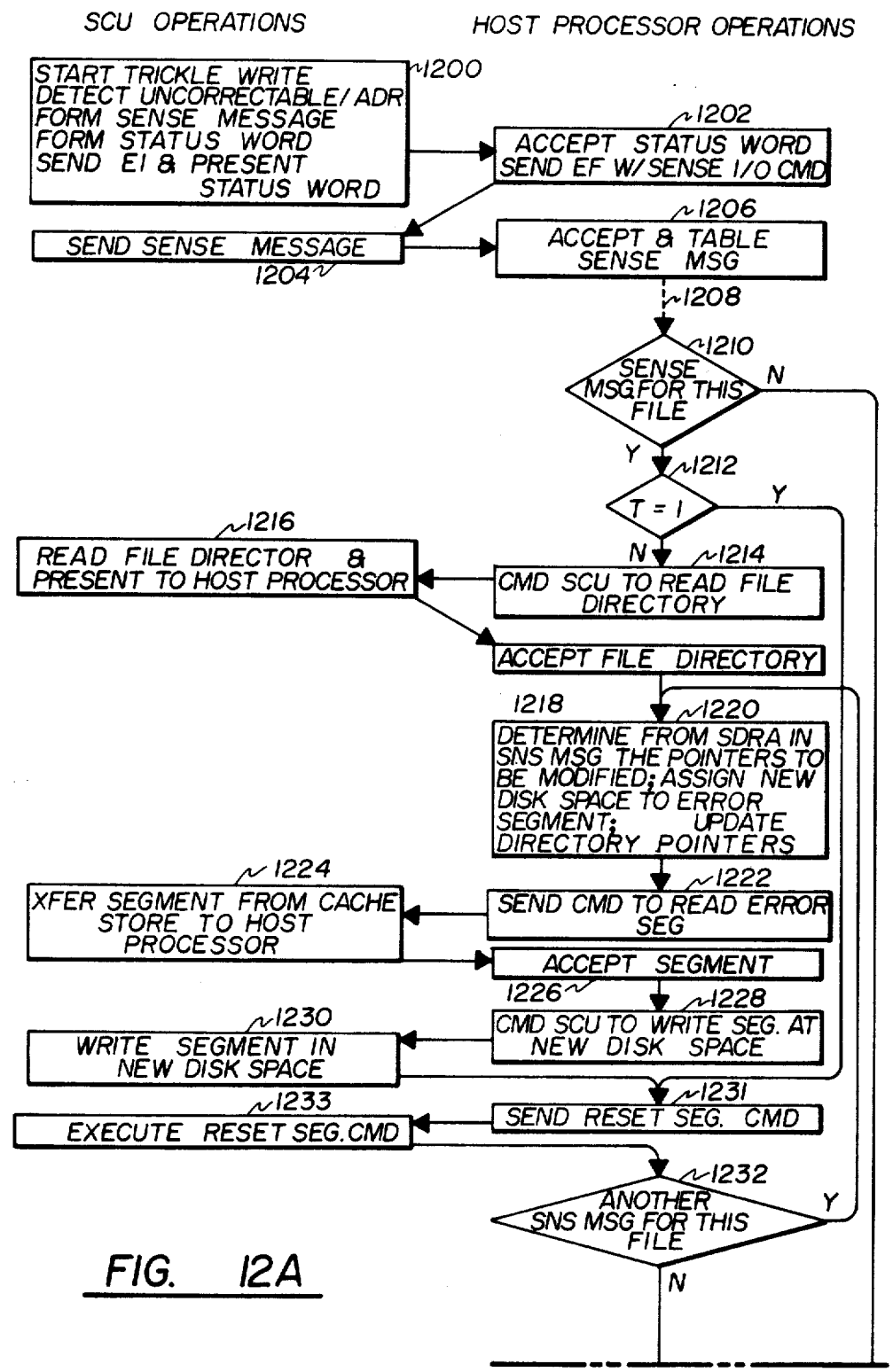

FIG. 12 is a flow diagram illustrating the sequence of operations performed in order to write a segment of data into newly assigned disk space when the segment cannot be trickled to its normal disk space because of an uncorrectable error in an address field in that disk space. For simplicity, this segment will be called the error segment. At step 1200 the SCU begins execution of a Trickle Write command but detects an uncorrectable address as described above. The SCU forms a sense message, forms a status word, places the status word in an output register, and sends an external interrupt (EI) tag through the channel unit to the host processor. At step 1202 the host processor responds to the EI by accepting the status word. The host processor utilizes the status action field of the status word to index into a table which contains the branch address of the first instruction of a routine governing what the host processor is to do next. Since the status action is "OB" the host processor branches to a routine which causes the host processor to issue an EF tag with a Sense I/O command.

At step 1204 the SCU responds to the Sense I/O command by transmitting the sense message to the host processor. As indicated at step 1206, the host processor accepts the sense message as it is sent by the SCU and stores the sense message in a table of sense messages. The host processor and the SCU then proceed to do other work and nothing is done with the sense message until the file is free or ready to be closed. Thus, as indicated by the broken line 1208 an indeterminate interval of time may elapse between steps 1206 and 1210.

When the file is free or ready to be closed the host processor uses the file number to search the table of sense messages to see if there is a sense message for the file being closed. If there is not a sense message then the program jumps from step 1210 to step 1240 and the file is closed.

If step 1210 reveals that there is a sense message for the file being closed then the Temporary (T) bit of the file number word (see FIG. 11, bit 1) is checked at step 1212 to see if it is set. Bit T of the file number word is transferred from the host processor to the SCU with the file number as part of a command and remains in the segment descriptor table entry (or entries) corresponding to the segment (or segments) involved in the commanded operation. If bit T is set it indicates that the related information is of a temporary nature such that it is not necessary to recover from a fault so as to write the information on a disk. In this case, the host processor issues a Reset Segment command (step 1231) to the SCU to reset the floater and written-to bits in the SDT entry for the error segment. This frees the segment storage space in the cache store for further use.

If bit T is not set it indicates that the related information is important (i.e. payroll data, etc.) and all efforts must be made to write the data on a disk. Bit T of the file number field is tested at step 1212 and if it is not set the host processor sends a Read command to the SCU, the Read command having the file number in the address. At step 1216 the SCU reads the file directory from the disk and presents it to the host processor.

Figure 3B:
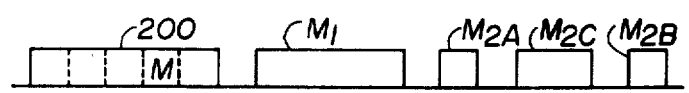

At step 1220 the host processor determines which pointers in the file directory must be modified, updates the copy of the directory pointers in the host processor, and assigns new disk space to the error segment. Referring for the moment to FIGS. 3A and 3B, assume that when file M was opened the user program indicated it would need 100,000 words of file space and from the table of available space the host processor assigned disk spaces $M_1$ and $M_2$ to the file, each disk space being capable of holding 50,000 words. As a result, the host processor would have recorded in the directory 200 at address M the address of the first word and the number of words in each of the file spaces $M_1$ and $M_2$. Assume that the segment which cannot be written onto the disk has the address N which falls within the disk space $M_2$. The host processor determines the segment number of the faulty segment from the segment device relative address (SDRA) which it obtains from the sense message.

It is necessary to modify the directory pointers to reflect the reassignment of disk space to the error segment. The pointer for disk space $M_1$ remains unchanged. However, the processor replaces the pointer for disk space $M_2$ with three pointers reflecting the first address and length of the disk spaces $M_{2A}$, $M_{2B}$ and $M_{2C}$. The pointer for disk space $M_{2B}$ is created to contain segment N so that file logical space remains contiguous and free from holes even though physical space is discontiguous.

At step 1222 the host processor sends a command to the SCU to read the error segment. At step 1224 the SCU transfers the error segment from the cache store to the host processor. The host processor accepts the segment and at step 1228 generates a command to write the segment at the newly assigned space. This command may be a Store Through command as explained in Application A. In response to the command the SCU writes the segment in the newly assigned disk space.

After the host processor issues the command at step 1228, it issues a Reset Segment command to the SCU at step 1231 to reset the written-to bit in the SDT entry corresponding to the error segment thus freeing this segment space in the cache store for further use. After the SCU executes the Reset Segment command at step 1233, the host processor then checks (at step 1232) the table of sense messages to see if there is another sense message for file M. If there is, the host processor program branches back to step 1220 where it assigns new disk space to the next error segment and updates the directory pointers as described above.

If step 1232 shows that there are no more sense messages in the sense message table relating to file M then the host processor issues a command to the SCU to write the updated directory pointers into address M and at step 1236 the SCU executes this command. After the host processor executes step 1234 it may then proceed to close the file.

While the invention has been particularly shown and described with reference to a preferred embodiment thereof, it will be understood by those skilled in the art that various changes in form and detail may be made therein without departing from the spirit and scope of the invention as defined by the appended claims.

The embodiments of the invention in which an exclusive property or privilege is claimed are defined as follows:

1. In a cache/disk system including a host processor for issuing commands specifying an operation to be performed and an address, a disk drive device for driving a disk, a cache store for storing segments of data, a segment descriptor store for storing a segment descriptor corresponding to each of said segments of data, and a storage control unit interfacing with said host processor, said disk drive device, said cache store and said segment descriptor store, said storage control unit including means for destaging to said disk segments of data which have been written to while in said cache store, the improvement comprising:

means in said host processor for issuing a file number as part of a command, said file number specifying an address in a directory recorded on said disk;

means in said storage control unit for storing said file number as part of the segment descriptor associated with a data segment involved in the operation specified by the command;

detecting means for detecting when said means for destaging segments of data to said disk is unable to destage a segment;

means responsive to said detecting means for generating a status word and a sense message, said sense message including said file number;

means for transmitting said status word and said sense message to said host processor;

means in said host processor responsive to said sense message for reading into the host processor the segment of data which could not be destaged and for assigning new disk space to store the segment of data which could not be destaged; and means in said storage control unit responsive to a command from the host processor for writing into the new disk space that segment of data which could not be destaged.

2. The improvement as claimed in claim 1 wherein:

the directory recorded on said disk comprises pointers to the physical disk space assigned to each file;

said host processor including means for issuing to said storage control unit a command including said file number, said storage control unit including means responsive to said file number in said command for reading the pointers to the physical disk space assigned to that file from said directory and transmitting them to said host processor.

3. The improvement as claimed in claim 2 wherein said host processor includes means responsive to said sense message and said pointers for determining the physical address space to which said storage control unit was unable to destage a segment and generating the address of the new disk space.

4. In a cache/disk system including a host processor for issuing commands specifying an operation to be performed and an address, a disk drive device for driving a disk, a cache store for storing segments of data, a segment descriptor store for storing a segment descriptor corresponding to each of said segments of data, and a storage control unit interfacing with said host processor, said disk drive device, said cache store, and said segment descriptor store, said storage control unit including means for destaging to said disk segments of data which have been written to while in said cache store, a method of facilitating recovery when said storage control unit is unable to destage a segment of data to the disk, said method comprising:

recording on said disk a directory comprising pointers to the disk space assigned to each file;

issuing a file number as part of a command issued by said host processor, said file number being the address in said directory of the pointers to the disk space assigned to the file represented by said file number;

storing said file number in a segment descriptor associated with a data segment involved in the operation specified by the command;

detecting when said storage control unit is unable to destage a data segment to said disk;

forming a sense message including said file number in said storage control unit when it is detected that a segment cannot be destaged to said disk;

transmitting said sense message from said storage control unit to said host processor;

determining from said message and said pointers in the directory the segment of data which could not be destaged;

assigning by said host processor new disk spa said segment which could not be destaged; and recording said segment which could not be destaged in said new disk space.

5. The method as claimed in claim 4 wherein said sense message is formed in said storage control unit, said method further comprising:

forming a status word in said storage control unit when it is detected that a segment of data cannot be destaged to said disk;

transmitting said status word to said host processor;

in response to said transmitted status word issuing a command to said storage control unit to transfer said sense message to said host processor; and issuing a command from said host processor to read from said disk into said host processor the pointers at the address specified by said file number, whereby the determination of the segment of data which could not be destaged is made in said host processor.

6. The method as claimed in claim 5 wherein the step of recording the segment of data which could not be destaged comprises:

issuing a command from said host processor to said storage control unit to read into the host processor the segment of data which could not be destaged;

issuing a command from said host processor to write said segment of data which could not be destaged on said disk in said new disk space; and transferring from said host processor through said storage control unit, to said disk the segment of data which could not be destaged.

7. The method as claimed in claim 4 wherein said host processor generates new directory pointers to reflect the assignment of new disk space to said segment, the updated directory then being stored on said disk at the address specified by said file number.

8. The method as claimed in claim 4 wherein said file number has an indicator associated therewith, the process being terminated between the steps of forming the sense message and determining which segment could not be destaged if said indicator is set.

* * * * *